(12) United States Patent
Voronin et al.

(10) Patent No.: US 11,637,242 B2
(45) Date of Patent: Apr. 25, 2023

(54) METHODS FOR RESISTIVE RAM (RERAM) PERFORMANCE STABILIZATION VIA DRY ETCH CLEAN TREATMENT

(71) Applicants: Tokyo Electron Limited, Tokyo (JP); SUNY Polytechnic Institute, College of Nanoscience and Engineering, Albany, NY (US)

(72) Inventors: Sergey Voronin, Albany, NY (US); Qi Wang, Albany, NY (US); Shyam Sridhar, Albany, NY (US); Karsten Beckmann, Albany, NY (US); Martin Rodgers, Albany, NY (US); Nathaniel Cady, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 323 days.

(21) Appl. No.: 16/999,441

(22) Filed: Aug. 21, 2020

(65) Prior Publication Data
US 2022/0059765 A1   Feb. 24, 2022

(51) Int. Cl.
*H01L 45/00* (2006.01)
*G11C 11/15* (2006.01)

(52) U.S. Cl.
CPC ........ *H01L 45/1675* (2013.01); *H01L 45/145* (2013.01); *G11C 11/15* (2013.01)

(58) Field of Classification Search
CPC .................................................. H01L 45/1675
See application file for complete search history.

(56) References Cited

U.S. PATENT DOCUMENTS

| 2010/0237314 A1* | 9/2010 | Tsukamoto ........ G11C 13/0004 257/E27.07 |
| 2012/0149195 A1 | 6/2012 | Kuniya |
| 2013/0302958 A1* | 11/2013 | Hossain ............ H01L 29/66734 438/270 |
| 2015/0179465 A1 | 6/2015 | Singh et al. |
| 2016/0300840 A1* | 10/2016 | Seo ........................ H01L 23/528 |

(Continued)

FOREIGN PATENT DOCUMENTS

| JP | 2011-071380 A | 4/2011 |
| WO | 2012-070551 A1 | 5/2012 |

OTHER PUBLICATIONS

Korean Intellectual Property Office, The International Search Report and Written Opinion for International Application No. PCT/US2021/045151, dated Nov. 19, 2021, 9 pages.

*Primary Examiner* — Mounir S Amer

(57) ABSTRACT

The performance of a ReRAM structure may be stabilized by utilizing a dry chemical gas removal (or cleaning) process to remove sidewall residue and/or etch by-products after etching the ReRAM stack layers. The dry chemical gas removal process decreases undesirable changes in the ReRAM forming voltage that may result from such sidewall residue and/or etch by-products. Specifically, the dry chemical gas removal process may reduce the ReRAM forming voltage that may otherwise result in a ReRAM structure that has the sidewall residue and/or etch by-products. In one embodiment, the dry chemical gas removal process may comprise utilizing a combination of HF and $NH_3$ gases. The dry chemical gas removal process utilizing HF and $NH_3$ gases may be particularly suited for removing halogen containing sidewall residue and/or etch by-products.

10 Claims, 5 Drawing Sheets

(56) References Cited

U.S. PATENT DOCUMENTS

2016/0359111 A1 12/2016 Kim et al.
2017/0229308 A1* 8/2017 Park .................. C11D 17/08
2022/0123207 A1* 4/2022 Min .................. H01L 27/2409

* cited by examiner

METHODS FOR RESISTIVE RAM (RERAM) PERFORMANCE STABILIZATION VIA DRY ETCH CLEAN TREATMENT

BACKGROUND

The present disclosure relates to methods for processing of substrates. In particular, it provides methods related to etching layers on substrates.

Device formation within microelectronic workpieces formed on substrates typically involves a series of manufacturing techniques related to the formation, patterning, and removal of layers of material on a substrate. To meet the physical and electrical specifications of current and next generation semiconductor devices, process flows are being requested to reduce feature size while maintaining structure integrity for various patterning processes.

Analog computing is considered to be the next revolution in computing in the post Moore's law era. Emerging memory technologies, such as resistive random access memory (ReRAM or RRAM), have gained attention in regards to the requirements of neuromorphic computing and other applications. ReRAM is of particular interest due to its non-volatile characteristics, scalability, and energy efficiency. A ReRAM device typically includes a resistive switching layer, such as for example hafnium oxide ($HfO_2$), which is sandwiched between two metal electrodes. The ReRAM device is patterned by a plasma etch of the electrodes and the switching layer. Reactive Ion Etch (RIE) techniques utilized to remove the electrode layers may form etch by-products and reactive plasma by-products on the ReRAM device sidewalls. The electrical characteristics of the ReRAM device are highly dependent upon the resistive switching layer and any contaminant species that may be in the resistive switching layer. Specifically, such contamination may be known to undesirably increase the ReRAM forming voltage. Materials deposited on the sidewalls during the ReRAM etch may diffuse into the ReRAM structure (including the resistive switching layer). Such diffusion contaminates the resistive switching layer. This may degrade the device performance and increase the ReRAM forming voltage. Such diffusion may occur over time, changing the forming voltage over time.

It would be desirable to limit the undesirable ReRAM etch effects mentioned above.

SUMMARY

As described herein, the performance of a ReRAM structure may be stabilized by utilizing a dry chemical gas removal (or cleaning) process to remove sidewall residue and/or etch by-products after etching the ReRAM stack layers. The dry chemical gas removal process decreases undesirable changes in the ReRAM forming voltage that may result from such sidewall residue and/or etch by-products. Specifically, the dry chemical gas removal process may reduce the ReRAM forming voltage that may otherwise result in a ReRAM structure that has the sidewall residue and/or etch by-products. In one embodiment, the dry chemical gas removal process may comprise utilizing a combination of hydrogen fluoride (HF) and ammonia ($NH_3$) gases. The dry chemical gas removal process utilizing HF and $NH_3$ gases may be particularly suited for removing halogen containing sidewall residue and/or etch by-products.

In a first method embodiment, a method of processing a resistive random access memory (ReRAM) device is provided. The method may comprise patterning a multi-layer ReRAM stack on a substrate, wherein a sidewall material is formed on sidewalls of the multi-layer ReRAM stack, and improving a forming voltage of the ReRAM device by removing the sidewall material from the sidewalls of the multi-layer ReRAM stack through the use of a dry chemical gas removal process. In one embodiment of the first method, the improving the forming voltage of the ReRAM device decreases the forming voltage of the ReRAM device by 10% or more as compared to not removing the sidewall material from the sidewalls of the multi-layer ReRAM stack. In another embodiment, the forming voltage of the ReRAM device decreases by at least 15%. In yet another embodiment of the first method, the sidewall material contains a halogen. In another embodiment, the dry chemical gas removal process comprises using HF gas and/or NH3 gas. In another embodiment, the patterning the multi-layer ReRAM stack on the substrate comprises etching at least part of the multi-layer ReRAM stack with a halogen containing plasma etch. In one example, the halogen is a chlorine.

In a second method embodiment, a method of processing a resistive random access memory (ReRAM) device is provided. The method comprises patterning a multi-layer ReRAM stack on a substrate, wherein a sidewall material is formed on sidewalls of the multi-layer stack, the sidewall material comprising at least a halogen, and removing the sidewall material from the sidewalls of the multi-layer ReRAM stack using a dry chemical gas removal process. In one embodiment of the second method, the removing the sidewall material from the sidewalls of the multi-layer ReRAM stack improves a forming voltage of the ReRAM device. In another embodiment, the removing the sidewall material from the sidewalls of the multi-layer ReRAM stack decreases the forming voltage of the ReRAM device by 10% or more as compared to not removing the sidewall material from the sidewalls of the multi-layer ReRAM stack. In one embodiment of the second method, the dry chemical gas removal process comprises using HF gas and/or NH3 gas. In one embodiment, the halogen comprises chlorine. In one embodiment of the second method, the multi-layer ReRAM stack includes a resistive switching layer comprising hafnium oxide, tantalum oxide, aluminum oxide, zirconium oxide, or titanium oxide. In another embodiment, the removing the sidewall material from the sidewalls of the multi-layer ReRAM stack limits chlorine contamination of the resistive switching layer.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

As described herein, methods are disclosed for processing ReRAM structures. A variety of advantages and implementations can be achieved while taking advantage of the process techniques described herein.

As indicated above, etching of a multi-layer stack including metal stacks for ReRAM memories can result in sidewall residue and by-products formed around the etched ReRAM stack structure. This residue may negatively impact and degrade the ReRAM device's electrical performance, particularly causing the ReRAM forming voltage to undesirably increase and/or change over time.

As described herein, the performance of a ReRAM structure may be stabilized by utilizing a dry chemical gas removal (or cleaning) process to remove sidewall residue and/or etch by-products after etching the ReRAM stack layers. The dry chemical gas removal process decreases undesirable changes in the ReRAM forming voltage that may result from such sidewall residue and/or etch by-products. Specifically, the dry chemical gas removal process may decrease the ReRAM forming voltage that may otherwise result in a ReRAM structure that has the sidewall residue and/or etch by-products. In one embodiment, the dry chemical cleaning process may comprise a dry chemical gas removal process utilizing a combination of HF and $NH_3$ gases to clean the substrate by removing the sidewall materials. The dry chemical cleaning process utilizing HF and $NH_3$ gases may be particularly suited for removing halogen containing sidewall residue and/or etch by-products.

FIGS. 1A-1D illustrate exemplary problems in prior solutions associated with etching ReRAM structures.

Figure 1A:
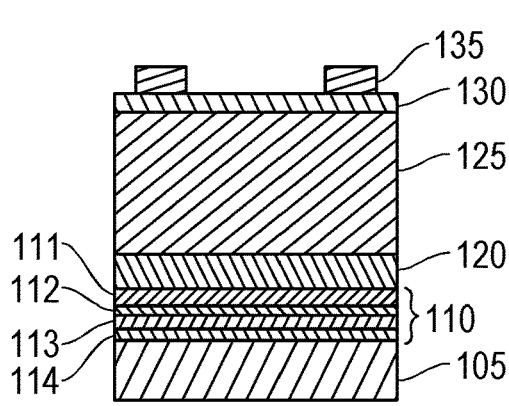
FIGS. 1A-1D provide cross-section diagrams of an example embodiment for a prior art ReRAM process flow.

FIGS. 1A-1D provide cross-section diagrams of an example embodiment for a ReRAM process flow. FIG. 1A shows a multi-layer structure 100 that can be formed on a substrate 105 for creating a microelectronic workpiece. The multi-layer structure 100 includes a multi-layer metal ReRAM stack 110. The multi-layer metal ReRAM stack 110 may be formed of, in one exemplary embodiment, a tantalum nitride (TaN) layer 111, upper titanium nitride (TiN) layer 112, $HfO_2$ layer 113, and lower TiN layer 114. It will be recognized that the ReRAM stack 110 described herein and shown in FIGS. 1A-1D is merely exemplary and other ReRAM stacks and materials may be utilized. For example, a wide variety of conductors are known to be usable as the conductor plates of the ReRAM. Further, the description of a $HfO_2$ layer 113 as the resistive switching dielectric layer of the ReRAM is merely exemplary as a variety of materials may be utilized, including for example but not limited to, metal oxides that can comprise a material selected from a group of materials comprising Hafnium Oxide (HfOx), Tantalum Oxide (TaOx), Aluminum Oxide (AlOx), Zirconium Oxide (ZrOx) and Titanium Oxide (TiOx) and their mixtures.

The multi-layer structure 100 may further include a hard mask layer 120 (in one exemplary embodiment silicon nitride (SiN)), and patterning layers such as a tri-layer including an organic layer 125, a silicon antireflective coating (SiARC) layer 130, and a photoresist layer 135. The organic layer 125 can be an organic planarization layer (OPL).

The multi-layer metal ReRAM stack 110 may include, in the exemplary embodiment, one or more Ti layers, TiAlN layers, TaAlN layers, TaN layers, TiN layers and/or other metal-containing layers or combinations of layers in addition to a resistive switching layer, such as $HfO_2$ and/or other resistive switching layer materials or combinations of materials.

Figure 1B:
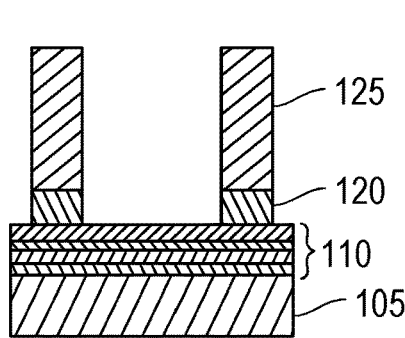
Figure 1C:
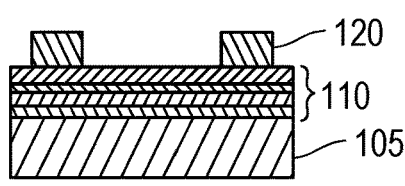
Figure 1D:
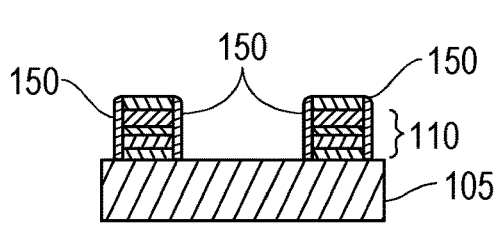

FIG. 1B provides an example embodiment of the multi-layer structure 100 after mask openings have been formed in the stacked structure using one or more etch processes to form a pattern in the hard mask layer 120. Next, FIG. 1C provides an example embodiment after an ash process has been performed to remove the organic layer 125. Finally, the FIG. 1D provides an example embodiment after a metal stack etch has been performed and the hard mask layer 120 removed so that the multi-layer metal ReRAM stack 110 is now patterned and remains. The metal stack is often etched using an RIE process. As shown in FIG. 1D, a sidewall material 150 may be formed on the sidewalls of the patterned multi-layer metal ReRAM stack 110 as a result of etch by-products and reactive plasma by-products.

As mentioned above, the sidewall material 150 may be a source of contaminants which may diffuse into the ReRAM stack 110. For example, when the etching process used to pattern the ReRAM stack includes halogen containing chemistries, the sidewall material 150 may contain the halogen. In one embodiment, the halogen may be chlorine. It has been found that chlorine diffusion into the ReRAM stack may impact the forming voltage of the ReRAM device.

Figure 2:
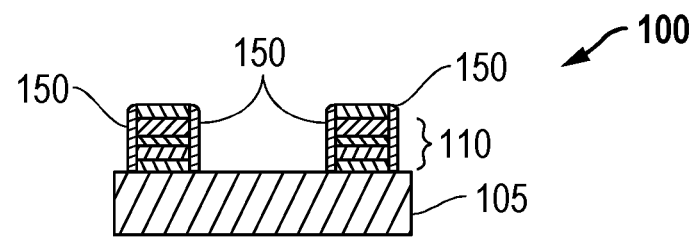
FIGS. 2-3 illustrate cross-section diagrams of one exemplary ReRAM process flow using the techniques described herein.
Figure 3:
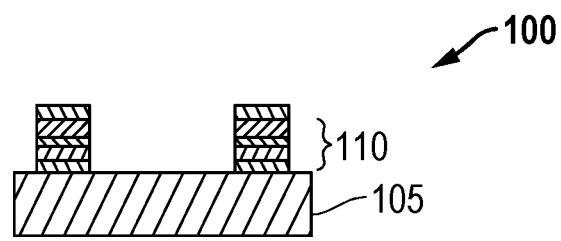

FIGS. 2-6 illustrate exemplary process flows utilizing the dry chemical gas removal techniques described herein for improving and stabilize the forming voltage performance of a ReRAM device. A first process flow embodiment is shown in FIGS. 2-3. As shown in FIG. 2, a multi-layer structure 100 which may be a ReRAM device structure is provided similar to the multi-layer structure 100 obtained in the step of FIG. 1D above. As shown in FIG. 2 sidewall material 150 is present. As described above, sidewall material 150 may include sidewall residue and/or etch by-products that may detrimentally impact the ReRAM forming voltage. According to the techniques described herein, the ReRAM device processing flow may further include a dry chemical gas removal process that is utilized to remove the sidewall material 150. Thus, as shown in FIG. 3, a multi-layer metal ReRAM stack 110 may be obtained that does not have the sidewall material 150 and the associated negative ReRAM performance impact of the sidewall material 150. The use of dry chemical gas removal process is also advantageous in that chemicals may be chosen which interact with the sidewall material with limited interaction with the other layers of the multi-layer structure 100. In this manner, the sidewall material 150 may be removed without significant impact on the critical dimensions of the multi-layer metal ReRAM stack 110.

Figure 4:
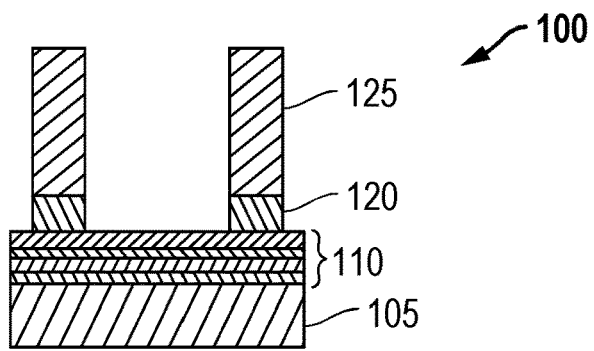
FIGS. 4-6 illustrate cross-section diagrams of another exemplary ReRAM process flow using the techniques described herein.
Figure 5:
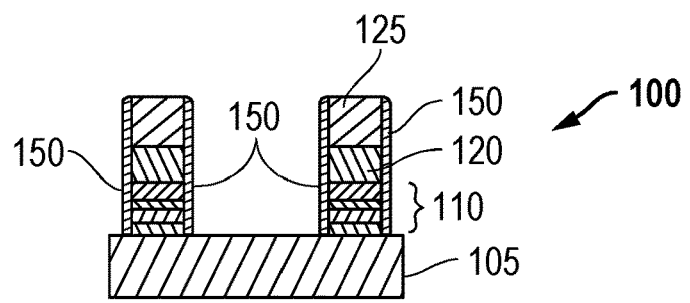
Figure 6:
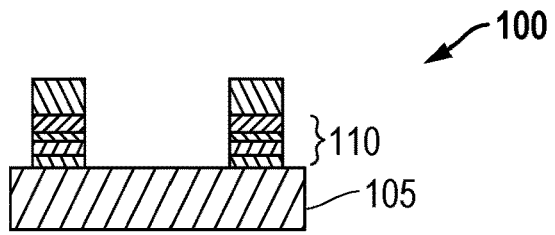

An alternative process flow utilizing the dry chemical gas removal techniques described herein is shown in FIGS. 4-6. As shown in FIG. 4, a multi-layer structure 100 which may be a ReRAM device structure is provided at a process step similar to the multi-layer structure 100 of FIG. 1B. Next, rather than immediately removing the organic layer 125, the etch of the multi-layer metal ReRAM stack 110 may be performed to yield the structure shown in FIG. 5. As shown in FIG. 5, sidewall material 150 is present similar to as described above with regard to other embodiments as a result of the etching of the multi-layer metal ReRAM stack 110. Next, the substrate may be exposed to an ash process to remove the organic layer 125 and a dry chemical gas removal process to remove the sidewall material 150. This yields the structure shown in FIG. 6, which as with the prior process flow, yields a ReRAM device in which the forming voltage will be more stabilized as a result of the removal of the sidewall material 150. The order of the process steps relating to the ashing process and sidewall removal may be ashing first, followed by the dry chemical gas removal process. Alternatively, the dry chemical gas removal process may be performed first, followed by the ashing step.

In one embodiment, the etch chemistries utilized to etch one or more layers of the multi-layer structure 100 may comprise a chlorine containing chemistry. In one specific embodiment, one or more etch steps utilized on the multi-layer structure 100 may comprise a chlorine containing gas utilized in a plasma etch process. The use of chlorine containing gases may yield residual chlorine in the sidewall material 150. Such chlorine can be contained in the sidewall material in any of a variety of forms including, but not limited to metal chlorides, metal oxychlorides, boron chloride, polymers, or other forms. Atomic chlorine from the sidewall material may then migrate into the resistive switching layer. Such migration may than occupy trap states of the resistive switching layer which results in lower leakage current and higher forming voltages for the ReRAM device. In one embodiment, the resistive switching layer impacted by the chlorine migration may be $HfO_2$ layer 113, though it will be recognized that the migration of contaminants from sidewall materials described herein may similarly impact resistive switching layers formed of other layers. Similarly, the contaminants provided from the sidewall material are not limited to chlorine containing contaminants as the techniques described herein may be applied to limit other contaminants.

In one exemplary embodiment, the presence of chlorine containing complexes in the sidewall material may result from the etch chemistry utilized to etch the multi-layer metal ReRAM stack 110. For example, in one exemplary embodiment, one or more of the layers of the ReRAM stack may be etched using a plasma etch process that utilizes (in at least one process step) gases such chlorine ($Cl_2$) or boron trichloride ($BCl_3$). As a result, residual chlorine (present in any of a variety of forms) may reside in the sidewall material 150. Thus, for example, one or more of the etch processes utilized during the process of etching (including post etch treatments) a TaN layer 111, upper TiN layer 112, $HfO_2$ layer 113, and lower TiN layer 114 may contain chlorine of some form.

In one embodiment, the dry chemical treatment applied to remove the sidewall material 150 may be comprised of a combination of HF and $NH_3$ gases. It will be recognized that the techniques described herein are not limited to a combination of HF and $NH_3$ gases, and other combinations and other gases may be utilized, including but not limited to fluorocarbons or nitrogen trifluoride in combination with hydrogen or nitrogen. The dry chemical treatment may be performed in the absence of a plasma, for example but not limited to, when utilizing a combination of HF and $NH_3$ gases. The use of fluorocarbons or nitrogen trifluoride in combination with hydrogen or nitrogen for the dry chemical treatment may be a plasma based dry chemical treatment. The use of a combination of HF and $NH_3$ gases for a dry chemical gas removal process is particularly well-suited for the removal of chlorine containing materials formed in the sidewall materials. This minimizes chlorine diffusion into the ReRAM device structure, minimizes the chlorine impact on ReRAM performance and significantly reduces the ReRAM forming voltage.

For example, the use of HF and $NH_3$ may provide a reaction mechanism for removal of the sidewall material as described below. It will be recognized that such mechanisms are merely described as exemplary, and the techniques provided herein are not limited to such reaction mechanism. For example, when etching metal layers with a chlorine containing chemistry such as described above, the sidewall material may be comprised of metal (M), oxygen (O) and $Cl_x$ solids (indicated as $MOCl_x$). Further, the use of $BCl_3$ may result in the sidewall material containing solid by-products in the form of $B_2Cl_4$. The reaction mechanism, which removes such sidewall materials using a HF and $NH_3$ chemical removal process, may include (solids indicated as (s) and gases as (g)):

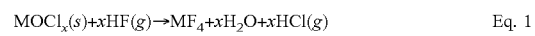   Eq. 1

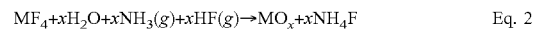   Eq. 2

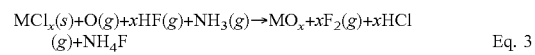   Eq. 3

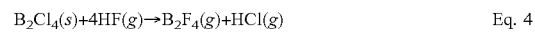   Eq. 4

The potential sources of the metal (M) with the sidewall material may be any of the metal containing layers of the multi-layer metal ReRAM stack 110. The potential sources of oxygen (O) may be organic layers of the multi-layer structure 100, the resistive switching layer (for example HfOx, TaOx, AlOx, Zirconium ZrOx, TiOx, etc.), or material in the etch chamber (including the etch chamber parts or materials deposited on the parts). It is noted that in the reaction mechanism results of Eq. 2, 3 and 4 above, $NH_4F$ may be volatized at temperatures above 100 degrees Celsius, and $B_2F_4$ is volatile having a boiling point of about −34 degrees Celsius. Again, as mentioned, it will be recognized that such reaction mechanisms are merely exemplary and other mechanisms may be utilized to achieve the desired improvements described herein.

In one embodiment, the dry chemical gas removal process utilizing HF and $NH_3$ may be performed in a separate process tool from the process tool used to perform the ReRAM stack etch. In one exemplary embodiment, the process tool may be a plasma-less dry etch tool. For example, process tools typically utilized for chemical oxide removal (COR) may be utilized. However, plasma based tools may also be utilized. In one embodiment, the dry chemical gas removal process utilizing HF and $NH_3$ may utilize a plasma-less process tool with process variable ranges of an operating pressures from 20 mTorr to 10 Torr, temperatures from 10 to 300 degrees Celsius, and process gas flow rates ($NH_3$ and HF) from 10 to 2000 standard cubic centimeters per minute (sccm).

As mentioned above, the removal of the sidewall material 150 may improve the forming voltage of the ReRAM device. In one exemplary embodiment, the forming voltage may be decreased by at least 10 percent, and in some cases more than 15 percent, compared to an ReRAM device having sidewall material 150. For example, in one embodiment, the forming voltage of a ReRAM may be decreased by at least 0.25 volts, and in some cases by 0.5 volts, by removing the sidewall material 150 as shown in FIGS. 3 and 6 and discussed above. One exemplary improvement may be seen when utilizing a $Cl_2$ and $BCl_3$ etch process of a multi-layer metal ReRAM stack 110 comprised of TaN layer 111, upper titanium nitride TiN layer 112, $HfO_2$ layer 113, and lower TiN layer 114. The addition of a HF and $NH_3$ chemical removal process may decrease a ReRAM forming voltage from 3.0 volts (when the sidewall material 150 is present) to less than 2.70 volts (and in one example even 2.5 volts when the dry chemical gas removal process described herein is utilized. Thus, a decrease of more than 15% of the ReRAM forming voltage may be obtained by removing the sidewall material with the dry chemical gas removal process described herein, as compared to not removing the sidewall material.

Figure 7:
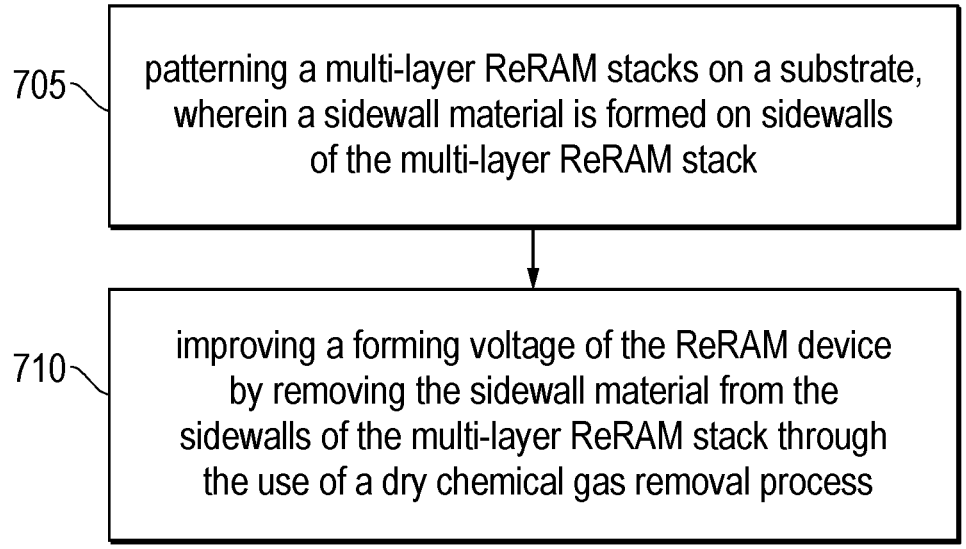
FIG. 7 illustrates a process flow diagram for an exemplary process utilizing the techniques disclosed herein.
Figure 8:
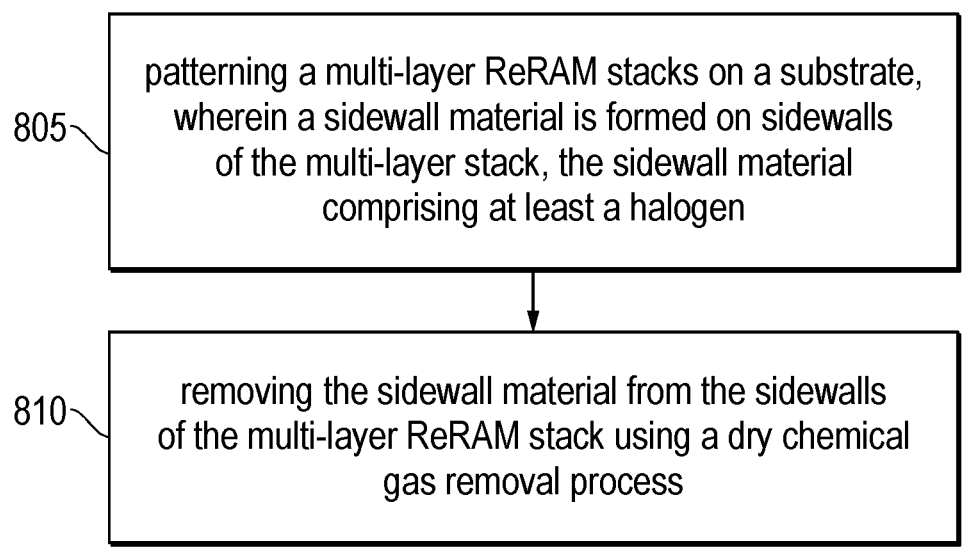
FIG. 8 illustrates a process flow diagram for another exemplary process utilizing the techniques disclosed herein.

FIGS. 7-8 illustrate exemplary methods for use of the processing techniques described herein. It will be recognized that the embodiments of FIGS. 7-8 are merely exemplary and additional methods may utilize the techniques described herein. Further, additional processing steps may be added to the methods shown in FIGS. 7-8 as the steps described are not intended to be exclusive. Moreover, the order of the steps is not limited to the order shown in FIGS. 7-8 as different orders may occur and/or various steps may be performed in combination or at the same time.

FIG. 7 illustrates a method of processing a resistive random access memory (ReRAM) device. The method may comprise step 705 of patterning a multi-layer ReRAM stack on a substrate, wherein a sidewall material is formed on sidewalls of the multi-layer ReRAM stack. The method further comprises step 710 of improving a forming voltage of the ReRAM device by removing the sidewall material from the sidewalls of the multi-layer ReRAM stack through the use of a dry chemical gas removal process.

FIG. 8 illustrates a method of processing a resistive random access memory (ReRAM) device. The method comprises step 805 of patterning a multi-layer ReRAM stack on a substrate, wherein a sidewall material is formed on sidewalls of the multi-layer stack, the sidewall material comprising at least a halogen. The method further comprises step 810 of removing the sidewall material from the sidewalls of the multi-layer ReRAM stack using a dry chemical gas removal process.

It is noted that embodiments described herein may be utilized within a wide range of processing equipment including plasma processing systems. For example, the techniques may be utilized with plasma etch processing systems, plasma deposition processing systems, other plasma processing systems, and/or other types of processing systems.

Figure 9:
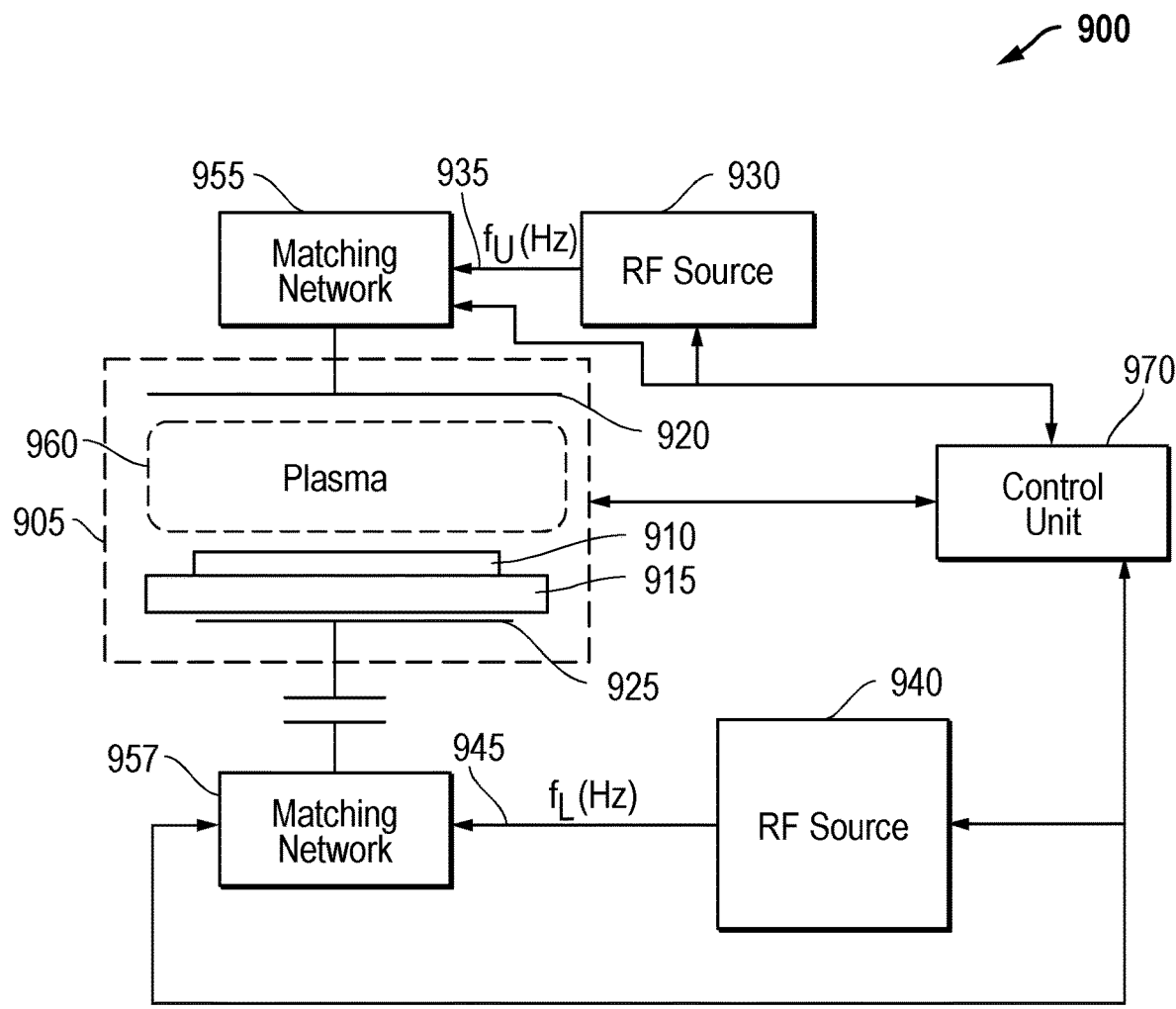
FIG. 9 illustrates an exemplary plasma etch tool for performing the etch techniques described herein.

FIG. 9 provides one example embodiment for a plasma processing tool 900 that can be used with respect to the disclosed techniques and is provided only for illustrative purposes. The plasma processing tool 900 may be a capacitively coupled plasma processing apparatus, inductively coupled plasma processing apparatus, microwave plasma processing apparatus, surface wave plasma processing apparatus, electron cyclotron resonance (ECR) plasma processing apparatus, or other type of processing system or combination of systems. Thus, it will be recognized by those skilled in the art that the techniques described herein may be utilized with any of a wide variety of plasma processing systems. The plasma processing tool 900 can be used for a wide variety of operations including, but not limited to, etching, deposition, cleaning, plasma polymerization, plasma-enhanced chemical vapor deposition (PECVD), atomic layer deposition (ALD), atomic layer etch (ALE), and so forth. The structure of a plasma processing tool 900 is well known, and the particular structure provided herein is merely of illustrative purposes. It will be recognized that different and/or additional plasma process systems may be implemented while still taking advantage of the techniques described herein.

Looking in more detail to FIG. 9, the plasma processing tool 900 may include a process chamber 905. As is known in the art, process chamber 905 may be a pressure-controlled chamber. A substrate 910 (in one example a semiconductor wafer) may be held on a stage or chuck 915. An upper electrode 920 and a lower electrode 925 may be provided as shown. The upper electrode 920 may be electrically coupled to an upper radio frequency (RF) source 930 through an upper matching network 955. The upper RF source 930 may provide an upper frequency voltage 935 at an upper frequency ($f_U$). The lower electrode 925 may be electrically coupled to a lower RF source 940 through a lower matching network 957. The lower RF source 940 may provide a lower frequency voltage 945 at a lower frequency ($f_L$). Though not shown, it will be known by those skilled in the art that a voltage may also be applied to the chuck 915.

Components of the plasma processing tool 900 can be connected to, and controlled by, a control unit 970 that in turn can be connected to a corresponding memory storage unit and user interface (all not shown). Various plasma-processing operations can be executed via the user interface, and various plasma processing recipes and operations can be stored in a storage unit. Accordingly, a given substrate can be processed within the plasma-processing chamber with various microfabrication techniques. It will be recognized that since control unit 970 may be coupled to various components of the plasma processing tool 900 to receive inputs from and provide outputs to the components.

The control unit 970 can be implemented in a wide variety of manners. For example, the control unit 970 may be a computer. In another example, the control unit includes one or more programmable integrated circuits that are programmed to provide the functionality described herein. For example, one or more processors (e.g., microprocessor, microcontroller, central processing unit, etc.), programmable logic devices (e.g., complex programmable logic device (CPLD)), field programmable gate array (FPGA), etc.), and/or other programmable integrated circuits can be programmed with software or other programming instructions to implement the functionality of a proscribed plasma process recipe. It is further noted that the software or other programming instructions can be stored in one or more non-transitory computer-readable mediums (e.g., memory storage devices, FLASH memory, DRAM memory, reprogrammable storage devices, hard drives, floppy disks, DVDs, CD-ROMs, etc.), and the software or other programming instructions when executed by the programmable integrated circuits cause the programmable integrated circuits to perform the processes, functions, and/or capabilities described herein. Other variations could also be implemented.

In operation, the plasma processing apparatus uses the upper and lower electrodes to generate a plasma 960 in the process chamber 905 when applying power to the system from the upper RF source 930 and the lower RF source 940. Further, as is known in the art, ions generated in the plasma 960 may be attracted to the substrate 910. The generated plasma can be used for processing a target substrate (such as substrate 910 or any material to be processed) in various types of treatments such as, but not limited to, plasma etching, chemical vapor deposition, treatment of semiconductor material, glass material and large panels such as thin-film solar cells, other photovoltaic cells, organic/inorganic plates for flat panel displays, and/or other applications, devices, or systems.

Application of power results in a high-frequency electric field being generated between the upper electrode 920 and the lower electrode 925. Processing gas delivered to process chamber 905 can then be dissociated and converted into a plasma. As shown in FIG. 9, the exemplary system described utilizes both upper and lower RF sources. For example, high-frequency electric power, for an exemplary capacitively coupled plasma system, in a range from about 3 MHz to 150 MHz or above may be applied from the upper RF source 930 and a low frequency electric power in a range from about 0.2 MHz to 40 MHz can be applied from the lower RF source. Different operational ranges can also be used. Further, it will be recognized that the techniques described herein may be utilized with in a variety of other plasma systems. In one example system, the sources may be switched (higher frequencies at the lower electrode and lower frequencies at the upper electrode). Further, a dual source system is shown merely as an example system and it will be recognized that the techniques described herein may be utilized with other systems in which a frequency power source is only provided to one electrode, direct current (DC) bias sources are utilized, or other system components are utilized.

It is noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

"Microelectronic workpiece" as used herein generically refers to the object being processed in accordance with the invention. The microelectronic workpiece may include any material portion or structure of a device, particularly a semiconductor or other electronics device, and may, for example, be a base substrate structure, such as a semiconductor substrate or a layer on or overlying a base substrate structure such as a thin film. Thus, workpiece is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation.

The term "substrate" as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed and patterned thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Systems and methods for processing a microelectronic workpiece are described in various embodiments. One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. A method of processing a resistive random-access memory (ReRAM) device, comprising:
  patterning a multi-layer ReRAM stack on a substrate, wherein a sidewall material is formed on sidewalls of the multi-layer ReRAM stack, the sidewall material containing chlorine introduced by the patterning process; and
  removing the sidewall material from the sidewalls of the multi-layer ReRAM stack through the use of a dry chemical gas removal process, the dry chemical gas including at least one of HF gas or $NH_3$ gas.

2. The method of claim 1, wherein the dry chemical gas removal process comprises using HF gas and $NH_3$ gas.

3. The method of claim 1, wherein the patterning the multi-layer ReRAM stack on the substrate comprises etching at least part of the multi-layer ReRAM stack with a halogen containing plasma etch.

4. A method of processing a resistive random access memory (ReRAM) device, comprising:
  patterning a multi-layer ReRAM stack on a substrate, wherein a sidewall material is formed on sidewalls of the multi-layer stack, the sidewall material comprising at least a halogen introduced by the patterning process; and
  removing the sidewall material from the sidewalls of the multi-layer ReRAM stack using a dry chemical gas removal process, the dry chemical gas including at least one of an HF gas or a $NH_3$ gas.

5. The method of claim 4, wherein the removing the sidewall material from the sidewalls of the multi-layer ReRAM stack improves a forming voltage of the ReRAM device.

6. The method of claim 5, wherein the removing the sidewall material from the sidewalls of the multi-layer ReRAM stack decreases the forming voltage of the ReRAM device by 10% or more as compared to not removing the sidewall material from the sidewalls of the multi-layer ReRAM stack.

7. The method of claim 4, wherein the halogen comprises chlorine.

8. The method of claim 7, wherein the multi-layer ReRAM stack includes a resistive switching layer comprising hafnium oxide, tantalum oxide, aluminum oxide, zirconium oxide, or titanium oxide.

9. The method of claim 8, wherein the removing the sidewall material from the sidewalls of the multi-layer ReRAM stack limits chlorine contamination of the resistive switching layer.

10. The method of claim 9, wherein the removing the sidewall material from the sidewalls of the multi-layer ReRAM stack decreases a forming voltage of the ReRAM device by 10% or more as compared to not removing the sidewall material from the sidewalls of the multi-layer ReRAM stack.

\* \* \* \* \*